US008896014B2

(12) United States Patent
Tanaka et al.

(10) Patent No.: US 8,896,014 B2
(45) Date of Patent: Nov. 25, 2014

(54) LIGHT-EMITTING ELEMENT, MANUFACTURING METHOD THEREOF, AND LIGHTING DEVICE

(75) Inventors: Koichiro Tanaka, Kanagawa (JP); Hisao Ikeda, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 227 days.

(21) Appl. No.: 13/303,590

(22) Filed: Nov. 23, 2011

(65) Prior Publication Data

US 2012/0126277 A1 May 24, 2012

(30) Foreign Application Priority Data

Nov. 24, 2010 (JP) ................................. 2010-260985

(51) Int. Cl.
*H01L 33/08* (2010.01)
*H01L 51/50* (2006.01)

(52) U.S. Cl.
CPC ........... *H01L 51/50* (2013.01); *H01L 2251/568* (2013.01); *H01L 2251/5361* (2013.01); *H01L 2251/5392* (2013.01)
USPC .............. 257/99; 257/E33.063; 257/E33.005; 438/46

(58) Field of Classification Search
None
See application file for complete search history.

(56) References Cited

U.S. PATENT DOCUMENTS

| 5,404,075 | A | 4/1995 | Fujikawa et al. |
| 7,045,822 | B2 | 5/2006 | Tsuchiya |
| 7,488,985 | B2 | 2/2009 | Tsuchiya |
| 7,932,667 | B2 | 4/2011 | Tsuchiya |
| 2003/0189401 | A1 | 10/2003 | Kido et al. |
| 2005/0170208 | A1 | 8/2005 | Yatsunami et al. |
| 2006/0008740 | A1 | 1/2006 | Kido et al. |
| 2007/0221944 | A1* | 9/2007 | Cheol Yoo ...................... 257/99 |
| 2011/0193129 | A1 | 8/2011 | Tsuchiya |

FOREIGN PATENT DOCUMENTS

| JP | 2824411 B2 | 11/1998 |
| JP | 2003-17262 | 1/2003 |
| JP | 2005-26121 | 1/2005 |

\* cited by examiner

*Primary Examiner* — Fei Fei Yeung Lopez
(74) *Attorney, Agent, or Firm* — Husch Blackwell LLP

(57) ABSTRACT

A light-emitting element includes a conductive layer functioning as a first electrode, an electroluminescent layer, and a conductive layer functioning as a second electrode, and further includes an insulating material filling a defect portion in the electroluminescent layer so that the defect portion is sealed. In the light-emitting element, the conductive layer functioning as a second electrode overlaps with the conductive layer functioning as a first electrode with the electroluminescent layer and the insulating material interposed therebetween and is in contact with a top surface of the electroluminescent layer.

7 Claims, 6 Drawing Sheets

LIGHT-EMITTING ELEMENT, MANUFACTURING METHOD THEREOF, AND LIGHTING DEVICE

BACKGROUND OF THE INVENTION

1. Field of the Invention

One embodiment of the present invention relates to a light-emitting element. One embodiment of the present invention relates to a lighting device including the light-emitting element in a light-emitting portion.

2. Description of the Related Art

In recent years, a light-emitting element which is one of the electro-optical elements and contains an organic compound or an inorganic compound which emits light by voltage application (the light-emitting element is also referred to as an electroluminescent element) has been developed.

The light-emitting element includes at least a first electrode, a second electrode, and an electroluminescent layer overlapping with the first electrode and the second electrode and emits light in accordance with voltage applied between the first electrode and the second electrode.

For example, the light-emitting element can be manufactured in such a manner that a first electrode is formed, an electroluminescent layer is formed over the first electrode, and a second electrode is formed over the electroluminescent layer.

However, a defect is generated in the electroluminescent layer at the time of the manufacture of the light-emitting element. The defect is generated, for example, due to particles such as dust on the first electrode. For example, when the second electrode is formed over the electroluminescent layer under the presence of the defect, there is a high possibility that the second electrode is in contact with the first electrode through the defect, which causes a short circuit between the first electrode and the second electrode.

As an example of the technique of preventing a short circuit between the first electrode and the second electrode, a technique is given in which an insulating material is formed to fill a defect in an electroluminescent layer, so that a short circuit between a first electrode and a second electrode through the defect is prevented (e.g., Patent Document 1).

[Patent Document 1] Japanese Published Patent Application No. 2003-017262

SUMMARY OF THE INVENTION

However, in the conventional technique of preventing a short circuit between a first electrode and a second electrode, such as the technique described in Patent Document 1, it is difficult to fill a defect portion in the electroluminescent layer with an insulating material while preventing the insulating material from being formed on a portion other than the defect portion. When the insulating material exists on the portion other than the defect portion in the electroluminescent layer, the insulating material serves as resistance, which causes a reduction in the emission characteristics of a light-emitting element.

Moreover, the conventional technique of preventing a short circuit between the first electrode and the second electrode has a problem in that the electroluminescent layer easily deteriorates when the defect portion in the electroluminescent layer is filled with the insulating material, which causes a reduction in the emission characteristics of the light-emitting element. For example, in the case where the electroluminescent layer is formed using an organic compound, the electroluminescent layer is melted or peeled when the defect portion in the electroluminescent layer is filled with the insulating material, which causes a reduction in the emission characteristics of the light-emitting element.

An object of one embodiment of the present invention is to suppress a reduction in the emission characteristics of a light-emitting element while preventing a short circuit between a first electrode and a second electrode of the light-emitting element.

One embodiment of the present invention includes a conductive layer functioning as a first electrode, an electroluminescent layer, and a conductive layer functioning as a second electrode, and further includes an insulating material which fills a defect portion existed in the electroluminescent layer so as to seal the defect portion. In the structure, the conductive layer functioning as a second electrode overlaps with the conductive layer functioning as a first electrode with the electroluminescent layer and the insulating material interposed therebetween and is in contact with a top surface of the electroluminescent layer.

The structure makes it possible to prevent the formation of the insulating material on a portion other than the defect portion in the electroluminescent layer, to suppress a reduction in the emission characteristics of the light-emitting element, while preventing a short circuit between the first electrode and the second electrode.

In one embodiment of the present invention, the electroluminescent layer may be a stack including a light-emitting layer and a metal oxide layer. In this case, the metal oxide layer is a top layer of the stack.

The structure enables the metal oxide layer to function as a protective layer so that the deterioration of the light-emitting element at the time when the defect portion in the electroluminescent layer is filled with the insulating material is reduced.

One embodiment of the present invention includes the steps of forming a conductive layer functioning as a first electrode; forming an electroluminescent layer over the conductive layer functioning as a first electrode; filling a defect portion existed in the electroluminescent layer with an insulating material so that the defect portion is sealed; and forming a conductive layer functioning as a second electrode over the electroluminescent layer and the insulating material so that the conductive layer functioning as a second electrode overlaps with the conductive layer functioning as a first electrode with the electroluminescent layer and the insulating material interposed therebetween. In the method, an insulating layer may be formed over the electroluminescent layer and the insulating layer may be selectively removed so that only part of the insulating layer, which fills the defect portion in the electroluminescent layer, remains. A light-emitting element is manufactured by the method, whereby a reduction in the emission characteristics of the light-emitting element can be suppressed and a short circuit between the first electrode and the second electrode can be prevented.

One embodiment of the present invention is a lighting device which includes the light-emitting element in a light-emitting portion.

According to one embodiment of the present invention, the formation of the insulating material between the electroluminescent layer and the second electrode can be suppressed as much as possible; thus, a reduction in the emission characteristics of the light-emitting element can be suppressed and a short circuit between the first electrode and the second electrode can be prevented.

DETAILED DESCRIPTION OF THE INVENTION

Examples of embodiments of the present invention will be described below with reference to the drawings. Note that it is easily understood by those skilled in the art that various changes and modifications can be made without departing from the spirit and scope of the present invention. Therefore, the present invention should not be limited to the description of the embodiments below.

Note that the contents in different embodiments can be combined with one another as appropriate. In addition, the contents in different embodiments can be replaced with one another.

Note also that ordinal numbers such as "first" and "second" are used for avoiding confusion between components and the number of components is not limited to the number of the ordinal numbers.

Embodiment 1

In this embodiment, examples of light-emitting elements will be described.

Note that the light-emitting element includes a first electrode, a second electrode, and an electroluminescent layer overlapping with the first electrode and the second electrode and emits light emitted from the electroluminescent layer in accordance with voltage applied between the first electrode and the second electrode.

Figure 1A:
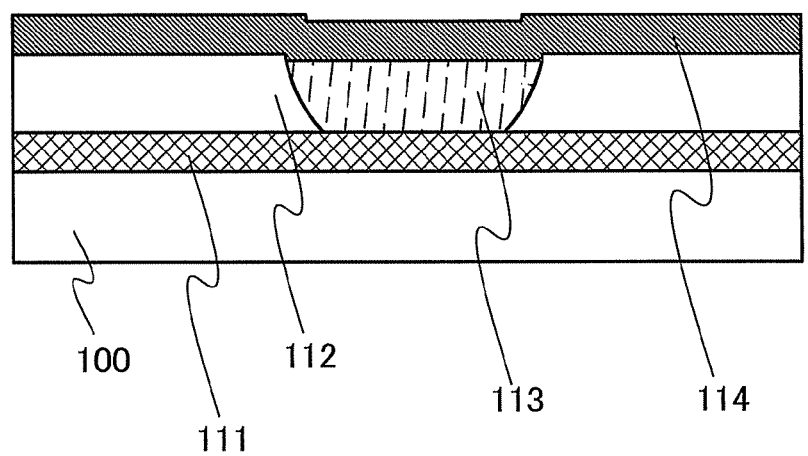
FIGS. 1A and 1B are cross-sectional schematic views illustrating structural examples of light-emitting elements in Embodiment 1.
Figure 1B:
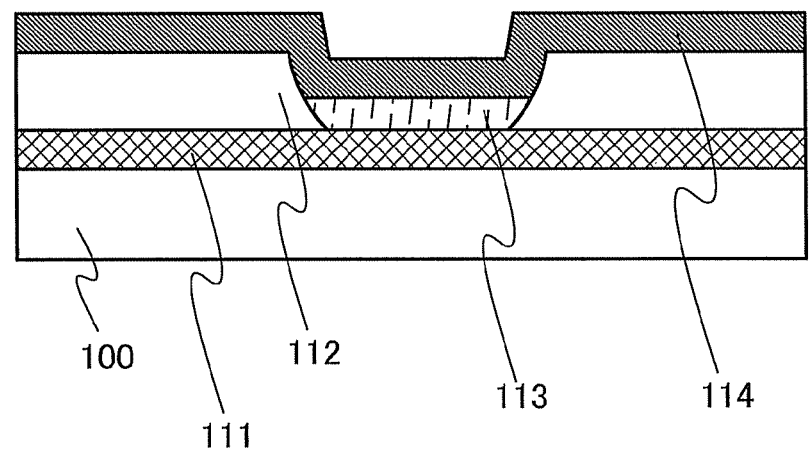

Structural examples of light-emitting elements in this embodiment will be described with reference to FIGS. 1A and 1B. FIGS. 1A and 1B are cross-sectional schematic views illustrating the structural examples of the light-emitting elements in this embodiment.

The light-emitting elements illustrated in FIGS. 1A and 1B each include a conductive layer 111, an electroluminescent layer 112, an insulating material 113, and a conductive layer 114.

The conductive layer 111 is formed over, for example, a layer 100 over which an element is formed (hereinafter, an element formation layer 100).

The element formation layer 100 is a layer over which an element can be formed.

The conductive layer 111 functions as a first electrode of the light-emitting element.

The conductive layer 111 can be, for example, a layer formed using a material including a metal material such as molybdenum, titanium, chromium, tantalum, tungsten, aluminum, copper, neodymium, or scandium. The conductive layer 111 can also be a layer containing a conductive metal oxide. As the conductive metal oxide, for example, a metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), or an alloy of indium oxide and zinc oxide ($In_2O_3$—ZnO); or the metal oxide containing silicon, silicon oxide, or nitrogen can be used. The conductive layer 111 can also be a stack of layers formed using materials applicable to the conductive layer 111. For example, in the case where the light-emitting element in this embodiment has a structure in which light is emitted downward (such a structure is also referred to as a bottom emission structure) or a structure in which light is emitted upward and downward (such a structure is also referred to as a dual emission structure), the conductive layer 111 can be a layer formed using a material which transmits light among the materials applicable to the conductive layer 111; in contrast, in the case where the light-emitting element in this embodiment has a structure in which light is emitted upward (such a structure is also referred to as a top emission structure), the conductive layer 111 can be a layer formed using a material which reflects light among the materials applicable the conductive layer 111.

The electroluminescent layer 112 emits light of a specific color.

The electroluminescent layer 112 includes at least a light-emitting layer. As the light-emitting layer, for example, a layer containing an electroluminescent material such as a fluorescent material or a phosphorescent material can be used.

The electroluminescent layer 112 can also be a stack of the light-emitting layer and another layer. In the case where the electroluminescent layer 112 has a stacked structure, the top layer of the electroluminescent layer 112 is preferably a metal oxide layer. In this case, the metal oxide layer preferably has conductivity. The metal oxide layer is formed as the top layer of the electroluminescent layer 112, whereby the deterioration of the electroluminescent layer 112 at the time of the manufacture of the light-emitting element can be suppressed; thus, a reduction in the emission characteristics of the light-emitting element can be suppressed.

The metal oxide layer can be a transition metal oxide layer or a layer of an oxide of a metal belonging to any of Groups 4 to 8 of the periodic table. For example, a layer formed using a material including vanadium oxide, niobium oxide, tantalum oxide, chromium oxide, molybdenum oxide, tungsten oxide, manganese oxide, or rhenium oxide can be used as the metal oxide layer. The metal oxide layer can also be a stack of layers formed using materials applicable to the metal oxide layer. For example, molybdenum oxide, which has a low hygroscopic property, is used for forming the metal oxide layer, whereby the deterioration of the electroluminescent layer 112 at the time of the manufacture of the light-emitting element can be suppressed; thus, a reduction in the emission characteristics of the light-emitting element can be suppressed.

A defect portion exists in the electroluminescent layer 112. As examples of a defect in the defect portion, a pinhole defect and the like are given. A part of the electroluminescent layer 112, which is thinner than the other part, is also included in the defect portion. The defect portion may go through the electroluminescent layer 112, from the top surface to the bottom surface of the electroluminescent layer 112. A plurality of defect portions may exist in the electroluminescent layer 112. FIGS. 1A and 1B each illustrate, as an example, the case where the defect portion goes through the electroluminescent layer 112, from the top surface to the bottom surface of the electroluminescent layer 112.

In each of FIGS. 1A and 1B, the defect portion in the electroluminescent layer 112 has a curved side surface. However, there is no particular limitation on the shape of the defect portion in the electroluminescent layer 112 in the light-emitting element of this embodiment.

The insulating material 113 fills the defect portion in the electroluminescent layer 112 so as to seal the defect portion. In this case, the conductive layer 114 is not in contact with the conductive layer 111 through the defect portion. For example, the insulating material 113 does not necessarily fill the entire defect portion in the electroluminescent layer 112 as illustrated in FIG. 1B. However, the more the insulating material 113 fills the defect portion, the more the concentration of electric field in the defect portion can be reduced.

Note that although the thickness of the insulating material 113 in each of FIGS. 1A and 1B is smaller than that of the electroluminescent layer 112, one embodiment of the present invention is not limited thereto. The thickness of the insulating material 113 in each of FIGS. 1A and 1B may be larger than or equal to that of the electroluminescent layer 112.

For example, a thermosetting resin, a thermoplastic resin, a photosensitive resin, or the like can be used for the insulating material 113. A photoresist, which is an example of the photosensitive resin, can be used for the insulating material 113. Besides, for example, an epoxy resin, a phenol resin, a silicone resin, a polyimide resin, an acrylic resin, or the like can be used for the insulating material 113.

The conductive layer 114 overlaps with the conductive layer 111 with the electroluminescent layer 112 and the defect portion in the electroluminescent layer 112 interposed therebetween and is in contact with the top surface of the electroluminescent layer 112. The conductive layer 114 functions as a second electrode of the light-emitting element.

The conductive layer 114 can be, for example, a layer formed using a material including a metal material such as molybdenum, titanium, chromium, tantalum, tungsten, aluminum, copper, neodymium, or scandium. The conductive layer 114 can also be a layer containing a conductive metal oxide. As the conductive metal oxide, for example, a metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), or an alloy of indium oxide and zinc oxide ($In_2O_3$—ZnO); or the metal oxide containing silicon, silicon oxide, or nitrogen can be used. The conductive layer 114 can also be a stack of layers formed using materials applicable to the conductive layer 114. For example, in the case where the light-emitting element has a structure in which light is emitted upward, the conductive layer 114 can be a layer formed using a material which transmits light among the materials applicable to the conductive layer 114; in contrast, in the case where the light-emitting element has a structure in which light is emitted downward, the conductive layer 114 can be a layer formed using a material which reflects light among the materials applicable to the conductive layer 114.

The above are the structural examples of the light-emitting elements, which are illustrated in FIGS. 1A and 1B.

In the case where, for example, a defect portion is generated in the electroluminescent layer 112 due to particles such as dust existing on the conductive layer 111, the particles might remain in the defect portion in the electroluminescent layer 112. The remaining particles might cause a portion in the electroluminescent layer 112, which has a small thickness or a portion where the electroluminescent layer 112 is not formed, for example, near the particles. In this case, when the light-emitting element includes the conductive layer 111, the electroluminescent layer 112 over the conductive layer 111, the particle in the defect portion in the electroluminescent layer 112, and the insulating material 113 which fills a gap between the particle and the electroluminescent layer so as to seal the gap, and the conductive layer 114 which is in contact with the top surface of the electroluminescent layer 112 and an upper portion of the insulating material 113, the conductive layer 111 and the conductive layer 114 can be prevented from being in contact with each other through the gap between the particle and the electroluminescent layer 112.

According to the structural examples of the light-emitting elements of this embodiment, which are described with reference to FIGS. 1A and 1B, the light-emitting element includes the conductive layer which functions as a first electrode, the electroluminescent layer provided over the first electrode, and the conductive layer which is in contact with the top surface of the electroluminescent layer and functions as a second electrode.

Further, the defect portion exists in the electroluminescent layer. According to the structural examples of the light-emitting elements of this embodiment, the light-emitting element further includes the insulating material filling the defect portion so that the defect portion is sealed. The conductive layer functioning as a second electrode is in contact with the upper portion of the insulating material; thus, a reduction in the emission characteristics of the light-emitting element can be suppressed.

The structure makes it possible to suppress a reduction in the emission characteristics of the light-emitting element and to prevent contact between the conductive layer functioning as a first electrode and the conductive layer functioning as a second layer in the defect portion in the electroluminescent layer. Thus, a short circuit between the first electrode and the second electrode can be prevented.

Embodiment 2

In this embodiment, structural examples of the electroluminescent layer of the light-emitting element in Embodiment 1 will be described.

Figure 2A:
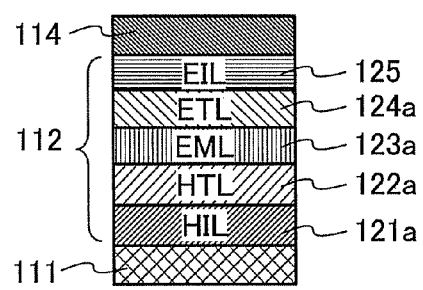
FIGS. 2A and 2B are cross-sectional schematic views illustrating structural examples of electroluminescent layers in Embodiment 2.
Figure 2B:
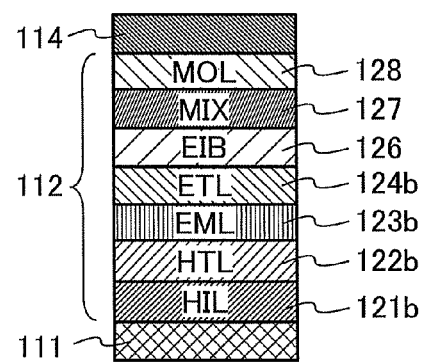

Structural examples of the electroluminescent layer 112 illustrated in FIG. 1A will be described with reference to FIGS. 2A and 2B as a structural example of the electroluminescent in this embodiment. FIGS. 2A and 2B are each a schematic view illustrating the structural example of the electroluminescent layer in this embodiment.

The electroluminescent layer 112 illustrated in FIG. 2A includes a hole-injection layer (HIL) 121a, a hole-transport layer (HTL) 122a, a light-emitting layer (EML) 123a, an electron-transport layer (ETL) 124a, and an electron-injection layer (EIL) 125.

The hole-injection layer 121a is provided over the conductive layer 111 illustrated in FIG. 1A. Note that the hole-injection layer 121a is not necessarily provided.

The hole-transport layer 122a is provided over the hole-injection layer 121a. Note that the hole-transport layer 122a is not necessarily provided.

The light-emitting layer 123a is provided over the hole-transport layer 122a.

The electron-transport layer 124a is provided over the light-emitting layer 123a. Note that the electron-transport layer 124a is not necessarily provided.

The electron-injection layer 125 is provided over the electron-transport layer 124a. Note that the electron-injection layer 125 is not necessarily provided.

In addition, the conductive layer 114 illustrated in FIG. 1A is provided over the electron-injection layer 125. The conductive layer 114 is in contact with the top surface of the electron-injection layer 125.

Note that in the case where the electroluminescent layer 112 illustrated in FIG. 1A has the structure illustrated in FIG.

2A and a defect portion goes through the electroluminescent layer 112, from the top surface to the bottom surface of the electroluminescent layer 112, the defect portion goes through the electroluminescent layer 112, from the top surface of the electroluminescent layer 112 (the top surface of the electron-injection layer 125) to the bottom surface of the electroluminescent layer 112 (the bottom surface of the hole-injection layer 121a). In addition, the insulating material 113 illustrated in FIG. 1A fills the defect portion so as to seal the defect portion.

The electroluminescent layer 112 illustrated in FIG. 2B includes a hole-injection layer 121b, a hole-transport layer 122b, a light-emitting layer 123b, an electron-transport layer 124b, an electron-injection buffer layer (EIB) 126, a composite material layer (MIX) 127, and a metal oxide layer (MOL) 128.

The hole-injection layer 121b is provided over the conductive layer 111 illustrated in FIG. 1A. Note that the hole-injection layer 121b is not necessarily provided.

The hole-transport layer 122b is provided over the hole-injection layer 121b. Note that the hole-transport layer 122b is not necessarily provided.

The light-emitting layer 123b is provided over the hole-transport layer 122b.

The electron-transport layer 124b is provided over the light-emitting layer 123b. Note that the electron-transport layer 124b is not necessarily provided.

The electron-injection buffer layer 126 is provided over the electron-transport layer 124b. Note that the electron-injection buffer layer 126 is not necessarily provided.

The composite material layer 127 is provided over the electron-injection buffer layer 126. Note that the composite material layer 127 is not necessarily provided.

The metal oxide layer 128 is provided as the top layer of the electroluminescent layer 112 and is provided over the composite material layer 127 in FIG. 2B.

In addition, the conductive layer 114 illustrated in FIG. 1A is on and in contact with the metal oxide layer 128.

Note that in the case where the electroluminescent layer 112 illustrated in FIG. 1A has the structure illustrated in FIG. 2B and a defect portion goes through the electroluminescent layer 112, from the top surface to the bottom surface of the electroluminescent layer 112, the defect portion goes through the electroluminescent layer 112 from the top surface of the electroluminescent layer 112 (the top surface of the metal oxide layer 128) to the bottom surface of the electroluminescent layer 112 (the bottom surface of the hole-injection layer 121b). In addition, the insulating material 113 illustrated in FIG. 1A fills the defect portion so as to seal the defect portion.

Further, components in the electroluminescent layers in FIGS. 2A and 2B will be described.

The hole-injection layer 121a and the hole-injection layer 121b are layers for injecting carriers to the hole-transport layer 122a and the hole-transport layer 122b, respectively.

A layer containing a substance having a hole-injection property can be used as the hole-injection layer 121a and the hole-injection layer 121b.

Examples of the substance having a hole-injection property include molybdenum oxide, vanadium oxide, ruthenium oxide, tungsten oxide, and manganese oxide.

Other examples of the substance having a hole-injection property include phthalocyanine (abbreviation: $H_2Pc$) and copper phthalocyanine (abbreviation: CuPc).

Other examples of the substance having a hole-injection property include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the substance having a hole-injection property include an oligomer, a dendrimer, and a polymer. For example, poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), poly[N,N'-bis(4-butylphenyl)-N,N'-bis(phenyl)benzidine] (Poly-TPD), or the like can be used.

Other examples of the substance having a hole-injection property include poly(3,4-ethylenedioxythiophene)/poly(styrenesulfonic acid) (PEDOT/PSS) and polyaniline/poly(styrenesulfonic acid) (PAni/PSS).

A layer formed of a composite material containing an organic compound having a hole-transport property and an acceptor substance can be used as the hole-injection layer 121a and the hole-injection layer 121b. In this case, the organic compound contained in the composite material preferably has a hole mobility of $10^{-6}$ $cm^2/Vs$ or higher. The layer formed of a composite material in which an acceptor substance is mixed into a substance having a high hole-transport property is used as the hole-injection layer 121a and the hole-injection layer 121b, whereby holes from the conductive layer 111 illustrated in FIG. 1A are easily injected, which results in a reduction in the driving voltage of the light-emitting element. The layer formed of a composite material can be formed by, for example, co-evaporation of a substance having a high hole-transport property and an acceptor substance.

Examples of the organic compound contained in the composite material include an aromatic amine compound, a carbazole derivative, an aromatic hydrocarbon, and a high molecular compound (e.g., an oligomer, a dendrimer, or a polymer).

Other examples of the organic compound contained in the composite material include TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Other examples of the organic compound contained in the composite material include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis

[2-(1-naphthyl)phenyl]anthracene, and 2,3,6,7-tetramethyl-9,10-di(1-naphthyl)anthracene.

Other examples of the organic compound contained in the composite material include 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As the acceptor substance that is an electron acceptor, an organic compound such as 7,7,8,8-tetracyano-2,3,5,6-tetrafluoroquinodimethane (abbreviation: $F_4$-TCNQ) or chloranil, or a transition metal oxide can be used.

As the acceptor substance that is an electron acceptor, an oxide of a metal belonging to any of Groups 4 to 8 of the periodic table can also be used. For example, vanadium oxide, niobium oxide, tantalum oxide, chromium oxide, molybdenum oxide, tungsten oxide, manganese oxide, and rhenium oxide are preferable as the acceptor substance that is an electron acceptor because of their high electron-accepting property. Molybdenum oxide is more preferable because it is stable in the air, has a low hygroscopic property, and is easily handled.

The hole-injection layer 121a and the hole-injection layer 121b can be, for example, a layer formed using a composite material of any of the above electron acceptors and a high molecular compound such as PVK, PVTPA, PTPDMA, or Poly-TPD.

The hole-transport layer 122a and the hole-transport layer 122b are layers for transporting holes. The hole-transport layer 122a transports holes to the light-emitting layer 123a. The hole-transport layer 122b transports holes to the light-emitting layer 123b.

A layer containing a substance having a hole-transport property can be used as the hole-transport layer 122a and the hole-transport layer 122b.

An aromatic amine compound can be used as the substance having a hole-transport property.

Examples of the substance having a hole-transport property include NPB, TPD, 4,4',4"-tris(carbazol-9-yl)triphenylamine (abbreviation: TCTA), TDATA, MTDATA, 4,4'-bis[N-(spiro-9,9'-bifluoren-2-yl)-N-phenylamino]biphenyl (abbreviation: BSPB), PCzPCA1, PCzPCA2, and PCzPCN1.

The hole-transport layer 122a and the hole-transport layer 122b can be a layer containing CBP, TCPB, CzPA, or the like.

The hole-transport layer 122a and the hole-transport layer 122b can also be a layer containing PVK, PVTPA, PTPDMA, Poly-TPD, or the like.

Note that the hole-transport layer 122a and the hole-transport layer 122b can also be a stack of layers formed using materials applicable to the hole-transport layer 122a and the hole-transport layer 122b.

The light-emitting layer 123a and the light-emitting layer 123b are each a layer containing a light-emitting substance.

The light-emitting layer 123a and the light-emitting layer 123b can be, for example, a layer containing a host material and a fluorescent compound or a phosphorescent compound.

Examples of the fluorescent compound include a fluorescent material which emits blue light (blue fluorescent material), a fluorescent material which emits green light (green fluorescent material), a fluorescent material which emits yellow light (yellow fluorescent material), and a fluorescent material which emits red light (red fluorescent material).

Examples of the blue fluorescent material include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviated to PCBAPA).

Examples of the green fluorescent material include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N'N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA).

Examples of the yellow fluorescent material include rubrene and 5,12-bis(1,1'-biphenyl-4-yl)-6,11-diphenyltetracene (abbreviation: BPT).

Examples of the red fluorescent material include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound include a phosphorescent material which emits blue light (blue phosphorescent material), a phosphorescent material which emits green light (green phosphorescent material), a phosphorescent material which emits yellow light (yellow phosphorescent material), a phosphorescent material which emits orange light (orange phosphorescent material), and a phosphorescent material which emits red light (red phosphorescent material).

Examples of the blue phosphorescent material include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N, $C^{2'}$]iridium(III)picolinate (abbreviation: FIrpic), bis{2-[3',5'-bis(trifluoromethyl)phenyl]pyridinato-N,$C^{2'}$}iridium(III)picolinate (abbreviation: Ir(CF$_3$ppy)$_2$(pic)), and bis[2-(4',6'-difluorophenyl)pyridinato-N,$C^{2'}$]iridium(III)acetylacetonate (abbreviation: FIr(acac).

Examples of the green phosphorescent material include tris(2-phenylpyridinato-N,$C^{2'}$)iridium(III) (abbreviation: Ir(ppy)$_3$), bis[2-phenylpyridinato-N,$C^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$).

Examples of the yellow phosphorescent material include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)).

Examples of the orange phosphorescent material include tris(2-phenylquinolinato-N,$C^{2'}$)iridium(III) (abbreviation: Ir(pq)$_3$), bis(2-phenylquinolinato-N,$C^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5- isopropyl-3-methyl-2-phenylpyrazinato)iridium(III) (abbreviation: Ir(mppr-iPr)$_2$(acac)).

Examples of the red phosphorescent material include bis[2-(2'-benzo[4,5-α]thienyl)pyridinato-N,C$^{3'}$)iridium(III) acetylacetonate (abbreviation: Ir(btp)$_2$(acac)), bis(1-phenyl-isoquinolinato-N,C$^{2'}$)iridium(III)acetylacetonate (abbreviation: Ir(piq)$_2$(acac), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and (2,3,7,8,12,13,17,18-octaethyl-21H,23H-porphine)platinum(II) (abbreviation: PtOEP).

A rare earth metal complex can be used as the phosphorescent compound. The rare earth metal complex emits light from a rare earth metal ion (electron transition between different multiplicities), and thus can be used as the phosphorescent compound. Examples of the phosphorescent compound that can be used include tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)).

The light-emitting layer 123a and the light-emitting layer 123b may be a layer in which the light-emitting substance (guest material) is dispersed in another substance (host material). A substance which has a higher lowest unoccupied molecular orbital level (LUMO level) than the light-emitting substance and has a lower highest occupied molecular orbital level (HOMO level) than the light-emitting substance is preferably used as the host material.

Examples of the host material include a metal complex, a heterocyclic compound, a condensed aromatic compound, and an aromatic amine compound.

Examples of the host material include tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ), 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), CzPA, 3,6-diphenyl-9-[4-(10-phenyl-9-anthryl)phenyl]-9H-carbazole (abbreviation: DPCzPA), DNA, t-BuDNA, 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), DPAnth, 6,12-dimethoxy-5,11-diphenylchrysene, N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, and BSPB.

The host material can be constituted by using a plurality of the above materials applicable to the host material.

The light-emitting layer 123a and the light-emitting layer 123b are formed of a layer in which a guest material is dispersed in a host material, whereby the crystallization of the light-emitting layer 123a and the light-emitting layer 123b can be prevented and concentration quenching due to high concentration of the guest material can also be prevented.

The light-emitting layer 123a and the light-emitting layer 123b can be a layer containing a light-emitting substance that is a high molecular compound.

Examples of the light-emitting substance that is a high molecular compound include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Note that the light-emitting layer 123a and the light-emitting layer 123b can also be a stack of layers applicable to the light-emitting layer 123a and the light-emitting layer 123b. For example, by stacking light-emitting layers which emit light of different colors, a variety of emission colors can be obtained and the luminance can be improved. For example, by stacking a layer formed using a material which emits light of a first color and a layer formed using a material which emits light of a color which is complementary to the first color, a light-emitting layer which emits white light can be formed. A light-emitting layer which emits white light can be formed by, for example, stacking a light-emitting layer which emits blue light and a light-emitting layer which emits yellow light, or a light-emitting layer which emits blue green light and a light-emitting layer which emits red light.

In that case, by providing a charge generation layer between the light-emitting layers, the luminance of the light-emitting element can be improved while the current density of the light-emitting element is kept low, which results in an increase in the lifetime of the light-emitting element.

The electron-transport layer 124a and the electron-transport layer 124b are layers for transporting electrons. The electron-transport layer 124a transports electrons to the light-emitting layer 123a. The electron-transport layer 124b transports electrons to the light-emitting layer 123b.

The electron-transport layer 124a and the electron-transport layer 124b can be a layer containing a substance having an electron-transport property.

Examples of the substance having an electron-transport property include Alq, Almq$_3$, BeBq$_2$, BAlq, Zn(BOX)$_2$, Zn(BTZ)$_2$, PBD, OXD-7, CO11, TAZ, BPhen, BCP, PF-Py, and PF-BPy.

Note that the electron-transport layer 124a and the electron-transport layer 124b can be a stack of layers of materials applicable to the electron-transport layer 124a and the electron-transport layer 124b.

The electron-injection layer 125 is a layer for injecting electrons.

The electron-injection layer 125 can be a layer containing an alkali metal, an alkaline earth metal, a compound thereof, or the like. A layer formed using a material applicable to the electron-transport layer, in which an alkali metal, an alkaline earth metal, a compound thereof, or the like is contained, can also be used as the electron-injection layer 125.

The hole-injection layers 121a and 121b, the hole-transport layers 122a and 122b, the light-emitting layers 123a and 123b, the electron-transport layers 124a and 124b, and the electron-injection layer 125 can be formed by a method such as an evaporation method (including a vacuum evaporation method), an inkjet method, or a coating method.

The electron-injection buffer layer 126 is a layer which reduces the barrier for electron injection into the light-emitting layer 123b.

The electron-injection buffer layer 126 can be a layer containing a material having an electron-injection property, a material having a donor property, and a material having an electron-transport property.

Examples of the material having an electron-injection property or the material having a donor property include metal materials such as an alkali metal, an alkaline earth metal, and a rare earth metal, and a compound of the metal material.

Examples of the substance having an electron-transport property include Alq, Almq$_3$, BeBq$_2$, BAlq, Zn(BOX)$_2$, Zn(BTZ)$_2$, PBD, OXD-7, CO11, TAZ, BPhen, BCP, PF-Py, and PF-BPy.

The composite material layer 127 is a layer for transporting electrons.

The composite material layer 127 can be a layer formed using a composite material in which an acceptor substance is contained in the substance having a hole-transport property.

The metal oxide layer 128 is a protective layer. The metal oxide layer 128 is provided, whereby the deterioration of the electroluminescent layer 112 illustrated in FIG. 1A at the time of the manufacture of the light-emitting element can be suppressed.

The metal oxide layer 128 can be, for example, a transition metal oxide layer or a layer of an oxide of a metal belonging to any of Groups 4 to 8 of the periodic table. Examples of the metal oxide layer include layers containing vanadium oxide, niobium oxide, tantalum oxide, chromium oxide, molybdenum oxide, tungsten oxide, manganese oxide, and rhenium oxide. The metal oxide layer 128 can also be a stack of layers formed using materials applicable to the metal oxide layer 128. For example, molybdenum oxide, which has a low hygroscopic property, is used for forming the metal oxide layer 128, whereby the deterioration of the electroluminescent layer at the time of the manufacture of the light-emitting element can be suppressed; thus, a reduction in the emission characteristics of the light-emitting element can be suppressed.

The above are the structural examples of the electroluminescent layers illustrated in FIGS. 2A and 2B.

Note that an electroluminescent layer of a light-emitting layer may be formed by stacking a plurality of the electroluminescent layers illustrated in FIGS. 2A and 2B. As for a light-emitting element having such a structure, problems such as energy transfer and quenching of light hardly occur, and a light-emitting element which has both high emission efficiency and long lifetime can be easily obtained due to expansion in the choice of materials. Moreover, a light-emitting element which provides phosphorescence from one electroluminescent layer and fluorescence from another electroluminescent layer can be easily obtained.

According to the structural examples of the electroluminescent layers of the light-emitting element in this embodiment, which are described with reference to FIGS. 2A and 2B, the electroluminescent layer includes at least the light-emitting layer.

Further, according to the structural examples of the electroluminescent layers of the light-emitting element in this embodiment, the electroluminescent layer is the stack including the light-emitting layer and the metal oxide layer which is the top layer of the stack. This structure allows the deterioration of the electroluminescent layer at the time of the manufacture of the light-emitting element to be suppressed.

Embodiment 3

In this embodiment, an example of a manufacturing method of the light-emitting element described in Embodiment 1 will be described.

As an example of a manufacturing method of a light-emitting element in this embodiment, a manufacturing method of the light-emitting element illustrated in FIG. 1A will be described with reference to FIGS. 3A to 3E. FIGS. 3A to 3E are cross-sectional schematic views illustrating the example of the manufacturing method of the light-emitting element illustrated in FIG. 1A.

Figure 3A:
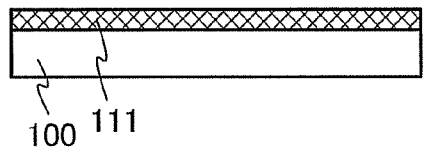
FIGS. 3A to 3E are cross-sectional schematic views illustrating an example of a manufacturing method of a light-emitting element in Embodiment 3.

First, as illustrated in FIG. 3A, the conductive layer 111 is formed over the element formation layer 100.

The conductive layer 111 can be formed by, for example, forming a film of a material applicable to the conductive layer 111 over the element formation layer 100 by a sputtering method. The conductive layer 111 may also be formed by stacking films of materials applicable to the conductive layer 111.

Figure 3B:
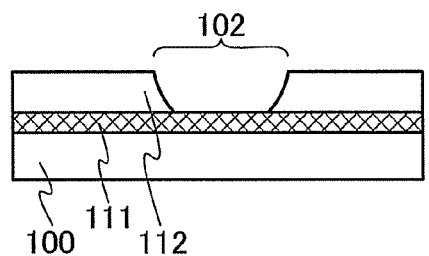

Next, as illustrated in FIG. 3B, the electroluminescent layer 112 is formed over the conductive layer 111. At this time, a defect portion 102 is generated in the electroluminescent layer 112.

The electroluminescent layer 112 can be formed by, for example, forming a light-emitting layer by a vacuum evaporation method, an inkjet method, a spin coating method, or the like. Note that in the case where the electroluminescent layer 112 is formed by stacking layers in addition to a light-emitting layer as in the examples of the electroluminescent layer described in Embodiment 2, the layers can be formed using materials applicable to the layers by, for example, a vacuum evaporation method, an inkjet method, a spin coating method, or the like.

Note that in this case, a metal oxide layer is preferably formed as the top layer of the electroluminescent layer 112. The metal oxide layer can be formed by, for example, a sputtering method, a vacuum evaporation method, an inkjet method, a spin coating method, or the like.

Figure 3C:
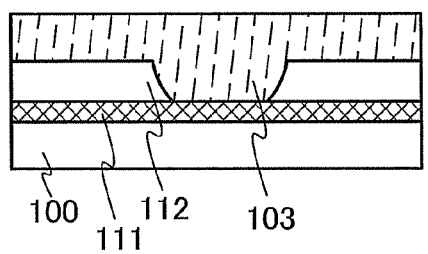

Next, as illustrated in FIG. 3C, an insulating layer 103 is formed over the electroluminescent layer 112, so that the defect portion 102 in the electroluminescent layer 112 is filled with part of the insulating layer 103 to be sealed.

The insulating layer 103 can be formed by, for example, forming a film of a material applicable to the insulating material 113 illustrated in FIG. 1A by a coating method or the like. The insulating layer 103 is formed to a thickness of, for example, 0.5 μm or more and 5 μm or less, so that the defect portion 102 in the electroluminescent layer 112 is filled with part of the insulating layer 103 to be sealed.

Figure 3D:
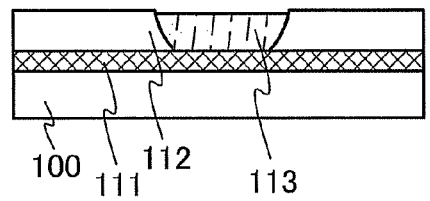

Next, as illustrated in FIG. 3D, part of the insulating layer 103 is removed so that the other part of the insulating layer 103, which fills the defect portion 102, remains, whereby an insulating material 113 is formed and the top surface of the electroluminescent layer 112 is exposed.

For example, ashing with oxygen plasma enables the part of the insulating layer 103 to be removed so that the other part of the insulating layer 103, which fills the defect portion 102, remains. Note that in the case where a metal oxide layer is provided as the top layer of the electroluminescent layer 112, the top surface of the metal oxide layer is exposed. The metal oxide layer is provided as the top layer of the electroluminescent layer, whereby the deterioration of the electroluminescent layer 112 at the time when the insulating material 113 fills the defect portion 102 can be easily suppressed.

Note that in the case where the insulating layer 103 is formed using a positive photosensitive resin, for example, light exposure is performed from the insulating layer 103 side with the time for the light exposure adjusted, whereby the part of the insulating layer 103 can be removed so that the other part of the insulating layer 103, which fills the defect portion 102, remains without being exposed to the light. In this case, it is preferable that the remaining part of the insulating layer 103 be stabilized by heat treatment.

Figure 3E:
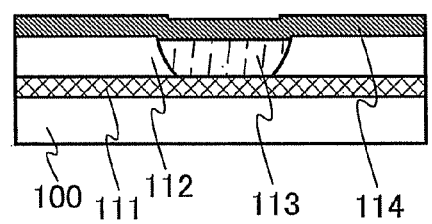

Next, as illustrated in FIG. 3E, the conductive layer 114 is formed over the electroluminescent layer 112 and the insulating material 113 so that the conductive layer 114 overlaps with the conductive layer 111 with the electroluminescent layer 112 and the insulating material 113 interposed therebetween. At this time, the conductive layer 114 is in contact with the top surface of the electroluminescent layer 112.

The conductive layer 114 can be formed in such a manner that, for example, a film of a material applicable to the conductive layer 114 is formed by a sputtering method so that the film is in contact with the upper portions of the electroluminescent layer 112 and the insulating material 113. The conductive layer 114 may also be formed by stacking films of materials applicable to the conductive layer 114.

The above is the example of the manufacturing method of the light-emitting element illustrated in FIG. 1A.

According to the example of the manufacturing method of the light-emitting element in this embodiment, which is described with reference to FIGS. 3A to 3E, the manufacturing method includes the steps of: forming the conductive layer functioning as a first electrode; forming the electroluminescent layer over the conductive layer functioning as a first electrode; forming an insulating layer over the electroluminescent layer so that the defect portion in the electroluminescent layer is selectively filled with part of the insulating layer so as to be sealed; removing the other part of the insulating layer so that the part of the insulating layer, which fills the defect portion, remains, whereby the insulating material is formed and the top surface of the electroluminescent layer is exposed; and forming the conductive layer functioning as a second electrode so that the conductive layer functioning as a second electrode is in contact with the top surface of the electroluminescent layer and the upper portion of the insulating material.

The method makes it possible to prevent contact between the conductive layer functioning as a first electrode and the conductive layer functioning as a second electrode, to prevent a short circuit between the first electrode and the second electrode, and to reduce the area of the insulating material which is in contact with the electroluminescent layer; thus, a reduction in the emission characteristics of the light-emitting element can be suppressed. Moreover, the method enables the insulating material to be formed only by selectively removing the insulating layer; thus, the manufacturing process can be simplified.

Embodiment 4

In this embodiment, an example of a manufacturing method of the light-emitting element described in Embodiment 1 will be described. Note that the description of the example of the manufacturing method of the light-emitting element in Embodiment 3 is referred to for the same parts as those in Embodiment 3 as appropriate.

As an example of a manufacturing method of a light-emitting element in this embodiment, a manufacturing method of the light-emitting element illustrated in FIG. 1A will be described with reference to FIGS. 4A to 4D. FIGS. 4A to 4D are cross-sectional schematic views illustrating the example of the manufacturing method of the light-emitting element illustrated in FIG. 1A.

Figure 4A:
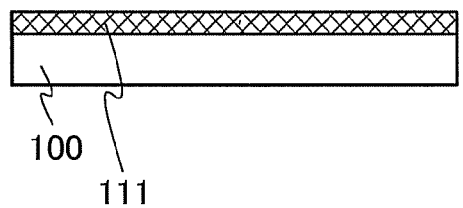
FIGS. 4A to 4D are cross-sectional schematic views illustrating an example of a manufacturing method of a light-emitting element in Embodiment 4.

First, as illustrated in FIG. 4A, the conductive layer 111 is formed over the element formation layer 100.

For example, the conductive layer 111 can be formed in a manner similar to that in the example of the manufacturing method of the light-emitting element, which is described with reference to FIG. 3A.

Figure 4B:
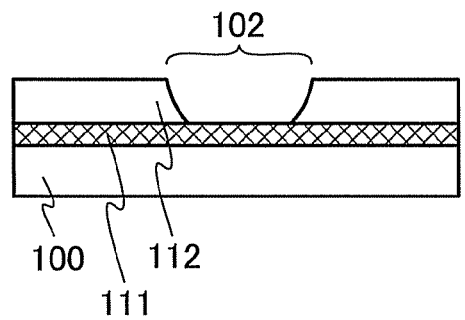

Next, as illustrated in FIG. 4B, the electroluminescent layer 112 is formed over the conductive layer 111. At this time, the defect portion 102 is generated in the electroluminescent layer 112.

For example, the electroluminescent layer 112 can be formed in a manner similar to that in the example of the manufacturing method of the light-emitting element, which is described with reference to FIG. 3B.

Figure 4C:
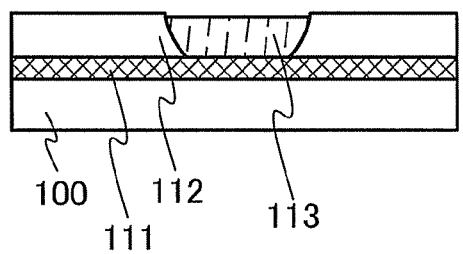

Next, as illustrated in FIG. 4C, the insulating material 113 fills the defect portion 102 in the electroluminescent layer 112 so as to seal the defect portion 102.

The insulating material 113 can be formed in such a manner that, for example, a resin applicable to the insulating material 113 fills the defect portion 102.

The insulating material 113 can be formed in such a manner that a resin applicable to the insulating material 113 fills the defect portion 102 by an inkjet method, a dispensing method, or the like. Note that the position of the defect portion 102 may be detected in advance by analysis of an image of the surface of the electroluminescent layer 112 or analysis of reflected light of laser light emitted to the top surface of the electroluminescent layer 112. When the insulating material 113 selectively fills the defect portion 102, the amount of the material used for forming the insulating material 113 can be reduced; thus, the manufacturing cost can be reduced.

Figure 4D:
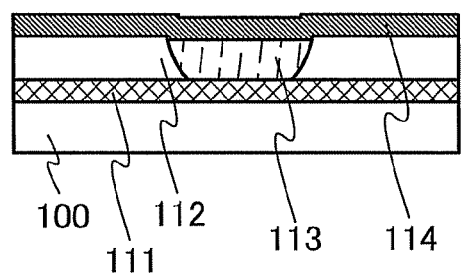

Next, as illustrated in FIG. 4D, the conductive layer 114 is formed over the electroluminescent layer 112 and the insulating material 113 so that the conductive layer 114 overlaps with the conductive layer 111 with the electroluminescent layer 112 and the insulating material 113 interposed therebetween. At this time, the conductive layer 114 is in contact with the top surface of the electroluminescent layer 112.

For example, the conductive layer 114 can be formed in a manner similar to that of the example of the manufacturing method of the light-emitting element, which is described with reference to FIG. 3E.

The above is the example of the manufacturing method of the light-emitting element illustrated in FIG. 1A.

According to the example of the manufacturing method of the light-emitting element in this embodiment, which is described with reference to FIGS. 4A to 4D, the manufacturing method includes the steps of: forming a first conductive layer (e.g., the conductive layer functioning as a first electrode); forming the electroluminescent layer over the first conductive layer; selectively filling the defect portion in the electroluminescent layer with the insulating material, whereby the defect portion is sealed; and forming a second conductive layer (e.g., the conductive layer functioning as a second electrode) so that the second conductive layer is in contact with the top surface of the electroluminescent layer and the upper portion of the insulating material.

The method makes it possible to prevent contact between the conductive layer functioning as a first electrode and the conductive layer functioning as a second electrode, to prevent a short circuit between the first electrode and the second electrode, and to reduce the area of the insulating material which is in contact with the electroluminescent layer; thus, the deterioration of the electroluminescent layer at the time of manufacture can be suppressed and a reduction in the emission characteristics of the light-emitting element can be suppressed. Moreover, the amount of materials used for forming the insulating material can be reduced, which results in a reduction in the manufacturing cost.

Embodiment 5

In this embodiment, examples of electronic devices each including the light-emitting element in any of the above embodiments will be described.

The light-emitting element in any of the above embodiments can be used in a light-emitting portion of a variety of electronic devices. Lighting devices to which the light-emitting element in any of the above embodiments can be applied will be described with reference to FIGS. 5A and 5B and FIGS. 6A to 6D as examples of electronic devices in this embodiment. FIGS. 5A and 5B and FIGS. 6A to 6D are schematic views illustrating the examples of the lighting devices in this embodiment.

Figure 5A:
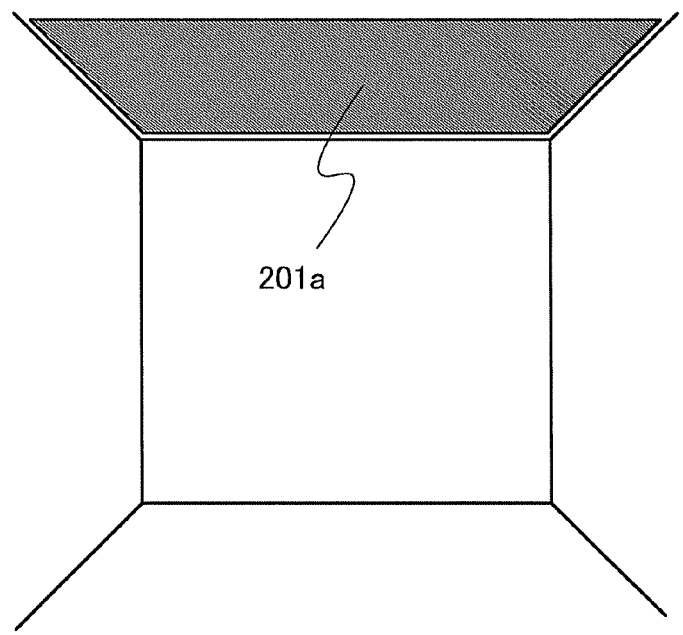
FIGS. 5A and 5B are schematic views illustrating examples of lighting devices in Embodiment 5.

FIG. 5A is a schematic view illustrating an example of a lighting device (i.e., a lighting device 201a) provided on a ceiling in a room.

The lighting device 201a includes the light-emitting element in any of the above embodiments and a control circuit for controlling light emission of the light-emitting element.

The lighting device is manufactured using the light-emitting element in any of the above embodiments as illustrated in FIG. 5A, whereby the area of the lighting device can be easily increased.

Figure 5B:
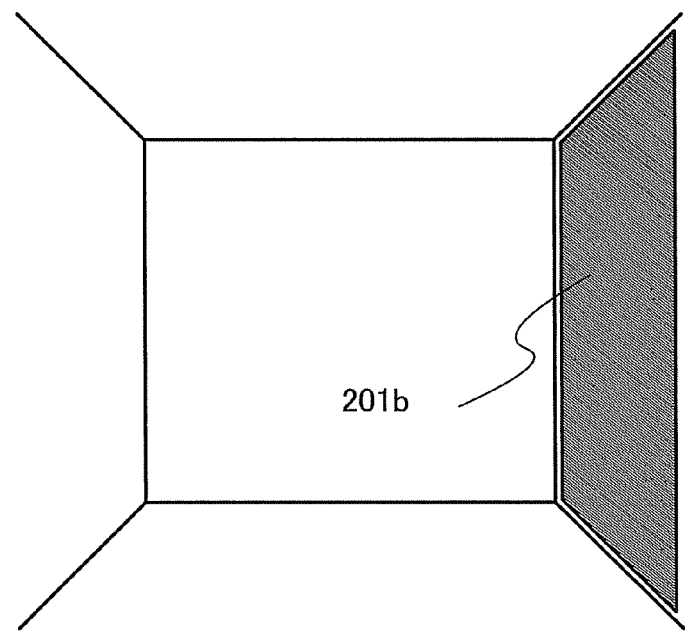

FIG. 5B is a schematic view illustrating an example of a lighting device (i.e., a lighting device 201b) provided on a wall in a room.

The lighting device 201b includes the light-emitting element in any of the above embodiments and a control circuit for controlling light emission of the light-emitting element.

The lighting device is manufactured using the light-emitting element in any of the above embodiments as illustrated in FIG. 5B, whereby the area of the lighting device can be easily increased. In addition, a light-transmitting glass substrate is used as a substrate used in the lighting device 201b, whereby the lighting device 201b can be used as window glass.

Further, the light-emitting element in any of the above embodiments can be used in a light-emitting portion of a lighting device such as a light unit which emits light to a display portion in a liquid crystal display device or the like. An example in which the light-emitting element in any of the above embodiments is used in a light-emitting portion in a light unit of a display device will be described below.

Figure 6A:
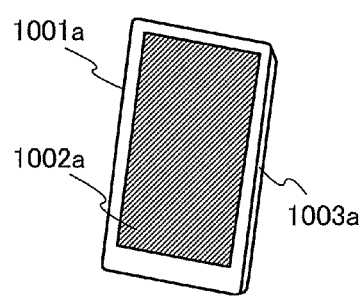
FIGS. 6A to 6D are schematic views illustrating examples of lighting devices in Embodiment 5.

An electronic device illustrated in FIG. 6A is an example of a portable information terminal. The information terminal illustrated in FIG. 6A includes a housing 1001a and a display portion 1002a provided in the housing 1001a.

Note that a side surface 1003a of the housing 1001a may be provided with a connection terminal to which an external device is connected and one or plural buttons for operating the portable information terminal illustrated in FIG. 6A.

The portable information terminal illustrated in FIG. 6A includes, in the housing 1001a, a CPU, a main memory, an interface with which signals are transmitted/received between the external device and the CPU and the main memory, an antenna which transmits and receives the signals to/from the external device, and a light unit which emits light to the display portion 1002a. Note that one or more integrated circuits with a specific function may be provided in the housing 1001a.

The portable information terminal illustrated in FIG. 6A serves, for example, as one or more of a telephone set, an e-book reader, a personal computer, and a game machine.

Figure 6C:
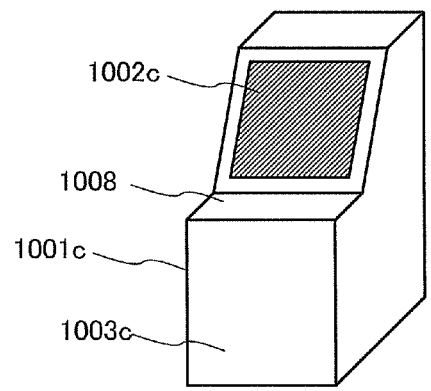
Figure 6B:
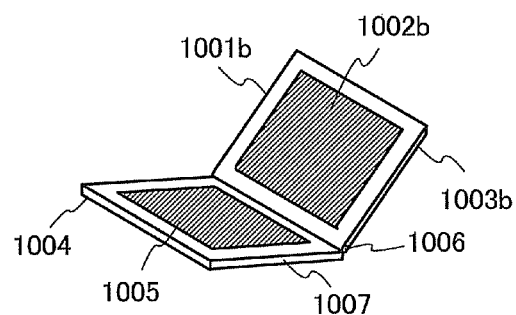

An electronic device illustrated in FIG. 6B is an example of a foldable portable information terminal. The portable information terminal illustrated in FIG. 6B includes a housing 1001b, a display portion 1002b provided in the housing 1001b, a housing 1004, a display portion 1005 provided in the housing 1004, and a hinge 1006 for connecting the housing 1001b and the housing 1004.

In the portable information terminal illustrated in FIG. 6B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with a connection terminal to which an external device is connected and one or more buttons for operating the portable information terminal illustrated in FIG. 6B.

The display portion 1002b and the display portion 1005 may display different images or one image. Note that the display portion 1005 is not necessarily provided; a keyboard which is an input device may be provided instead of the display portion 1005.

The portable information terminal illustrated in FIG. 6B includes, in the housing 1001b or the housing 1004, a CPU, a main memory, an interface with which signals are transmitted/received between the external device and the CPU and the main memory, and a light unit which emits light to the display portion 1002b and the display portion 1005. Note that one or more integrated circuits with a specific function may be provided in the housing 1001b or the housing 1004. In addition, the portable information terminal illustrated in FIG. 6B may include an antenna transmitting/receiving a signal to/from the external device.

The portable information terminal illustrated in FIG. 6B serves, for example, as one or more of a telephone set, an e-book reader, a personal computer, and a game machine.

An electronic device illustrated in FIG. 6C is an example of a stationary information terminal. The stationary information terminal illustrated in FIG. 6C includes a housing 1001c and a display portion 1002c provided in the housing 1001c.

Note that the display portion 1002c can also be provided on a deck portion 1008 of the housing 1001c.

The stationary information terminal illustrated in FIG. 6C includes, in the housing 1001c, a CPU, a main memory, an interface with which signals are transmitted/received between the external device and the CPU and the main memory, and a light unit which emits light to the display portion 1002c. Note that one or more integrated circuits with a specific function may be provided in the housing 1001c. In addition, the stationary information terminal illustrated in FIG. 6C may include an antenna transmitting/receiving a signal to/from the external device.

Further, a side surface 1003c of the housing 1001c of the stationary information terminal illustrated in FIG. 6C may be provided with one or more of a ticket slot from which a ticket or the like is dispensed, a coin slot, and a bill slot.

The stationary information terminal illustrated in FIG. 6C serves, for examples, as an automated teller machine, an information communication terminal for ticketing or the like (also referred to as a multi-media station), or a game machine.

Figure 6D:
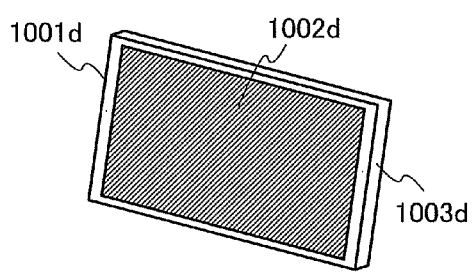

FIG. 6D illustrates an example of a stationary information terminal. The stationary information terminal illustrated in FIG. 6D includes a housing 1001d and a display portion 1002d provided in the housing 1001d. Note that a support for supporting the housing 1001d may also be provided.

Note that a side surface 1003d of the housing 1001d may be provided with a connection terminal to which an external device is connected and one or plural buttons for operating the stationary information terminal in FIG. 6D.

The stationary information terminal illustrated in FIG. 6D includes, in the housing 1001d, a light unit which emits light to the display portion 1002d. The stationary information terminal illustrated in FIG. 6D may also include, in the housing 1001d, a CPU, a main memory, and an interface with which signals are transmitted/received between the external device and the CPU and the main memory. One or more integrated circuits with a specific function may be provided in the housing 1001d. In addition, the stationary information terminal illustrated in FIG. 6D may include an antenna transmitting/receiving a signal to/from the external device.

The stationary information terminal illustrated in FIG. 6D serves, for example, as a digital photo frame, an input-output monitor, or a television device.

In each of the electronic devices illustrated in FIGS. 6A to 6D, the light-emitting element in any of the above embodiments can be used in the light-emitting portion of the light unit provided in the housing. The light-emitting element in any of the above embodiments is used in the light-emitting portion of the light unit, whereby the power consumption of the electronic device can be reduced. It is difficult to supply power to, in particular, a portable electronic device from the outside in some cases. For that reason, it is preferable that the light-emitting element in any of the above embodiments, which has low power consumption, be used in a light-emitting portion of a light unit.

Note that the light-emitting element in any of the above embodiments can be used in a light-emitting portion of a lighting device such as a desk lamp, an electronic signboard, an outdoor light, or a portable light source, without limitation to the lighting devices illustrated in FIGS. 5A and 5B and FIGS. 6A to 6D.

Further, a flexible substrate can be used as a substrate used in a lighting device, whereby a lighting device with a cylindrical or spherical light-emitting portion can be manufactured.

Note that a control circuit for controlling light emission of the light-emitting element in any of the above embodiments may be provided in a lighting device.

A lighting device may be manufactured using a plurality of the light-emitting elements in any of the above embodiments in a lighting portion. A plurality of the light-emitting elements in any of the above embodiments are used in a light-emitting portion, whereby the luminance of a lighting device can be improved. Moreover, for example, a lighting device which selectively emits light of a plurality of colors can be obtained.

Further, the light-emitting element in any of the above embodiments can be used, for example, as a light-emitting element (light-emitting portion) of a pixel in an electroluminescent display device, without limitation to the lighting device.

As described with reference to FIGS. 5A and 5B and FIGS. 6A to 6D, the lighting devices can be manufactured by providing the light-emitting element in any of the above embodiments in the light-emitting portions. A lighting device is manufactured by using the light-emitting element in any of the above embodiments in a light-emitting portion, whereby the power consumption of the lighting device can be reduced. Moreover, a lighting device is manufactured by using the light-emitting element in any of the above embodiments, whereby the light emission area of the lighting device can be easily increased.

This application is based on Japanese Patent Application serial no. 2010-260985 filed with the Japan Patent Office on Nov. 24, 2010, the entire contents of which are hereby incorporated by reference.

What is claimed is:

1. A light-emitting element comprising:
   a first conductive layer;
   an electroluminescent layer provided over the first conductive layer, wherein the electroluminescent layer is a stack comprising at least a light-emitting layer and a metal oxide layer which is a top layer of the stack;
   an insulating material filling a defect portion existed in the electroluminescent layer so as to seal the defect portion; and
   a second conductive layer overlapping with the first conductive layer with the electroluminescent layer and the insulating material interposed and the first conductive layer and the second conductive layer, the second conductive layer being in contact with a top surface of the metal oxide layer in the electroluminescent layer,
   wherein the second conductive layer is in contact with a side surface of the defect portion.

2. The light-emitting element according to claim 1, wherein the metal oxide layer is a molybdenum oxide layer.

3. A lighting device comprising the light-emitting element according to claim 1 in a lighting portion.

4. A light-emitting element comprising:
   a first conductive layer;
   a layer over the first conductive layer, wherein the layer comprises a light-emitting layer, and wherein the layer comprises a depressed portion;
   an insulating material in contact with a side surface of the depressed portion, wherein an upper surface of the insulating material is lower than an upper surface of the layer; and
   a second conductive layer over the insulating material and the layer,
   wherein the second conductive layer is in contact with the side surface of the depressed portion of the layer.

5. The light-emitting element according to claim 4,
   wherein the layer further comprising a metal oxide layer over the light-emitting layer, and
   wherein the metal oxide layer is in contact with the second conductive layer.

6. A lighting device comprising the light-emitting element according to claim 4.

7. A method for manufacturing a light-emitting element, comprising:
   forming a first conductive layer;

forming an electroluminescent layer over the first conductive layer by forming a stack comprising a light-emitting layer and a metal oxide layer which is a top layer of the stack;

forming an insulating layer over the metal oxide layer, so that a defect portion existed in the electroluminescent layer is filled with a part of the insulating layer so as to seal the defect portion;

removing the other part of the insulating layer so that the part of the insulating layer that fills the defect portion remains, so that an insulating material is formed and a top surface of the metal oxide layer is exposed;

forming a second conductive layer over the metal oxide layer in the electroluminescent layer and the insulating material so that the second conductive layer overlaps with the first conductive layer with the electroluminescent layer and the insulating material interposed between the first conductive layer and the second conductive layer, wherein the second conductive layer is in contact with a side surface of the defect portion.

* * * * *